(12) United States Patent
Nakashita

(10) Patent No.: US 12,223,198 B2
(45) Date of Patent: Feb. 11, 2025

(54) CONTROL APPARATUS TO ACHIEVE PERFORMANCE WHILE LOWERING TEMPERATURE OF A SOLID STATE DRIVE

(71) Applicant: CANON KABUSHIKI KAISHA, Tokyo (JP)

(72) Inventor: Tsunahito Nakashita, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 5 days.

(21) Appl. No.: 17/738,924

(22) Filed: May 6, 2022

(65) Prior Publication Data
US 2022/0382482 A1 Dec. 1, 2022

(30) Foreign Application Priority Data
May 25, 2021 (JP) ................. 2021-087538

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .... G06F 3/0655; G06F 3/0604; G06F 3/0679; G06F 1/3225; G06F 1/206; G06F 1/3275; G11C 7/04; Y02D 10/00
See application file for complete search history.

(56) References Cited

U.S. PATENT DOCUMENTS

| | | | |
|---|---|---|---|
| 10,725,509 B2 * | 7/2020 | Wang | G06F 11/0757 |
| 11,017,823 B1 * | 5/2021 | Kamepalli | G06F 1/206 |
| 2006/0039108 A1 * | 2/2006 | Chikusa | G06F 1/20 |
| 2006/0161375 A1 * | 7/2006 | Duberstein | G06F 1/3296 |
| | | | 702/132 |
| 2007/0140030 A1 * | 6/2007 | Wyatt | G11C 5/00 |
| | | | 365/212 |
| 2009/0018708 A1 * | 1/2009 | O'Neil | H01L 23/345 |
| | | | 700/300 |
| 2011/0137870 A1 * | 6/2011 | Feder | H04L 67/1001 |
| | | | 707/662 |
| 2016/0037686 A1 * | 2/2016 | Shabbir | G06F 1/206 |
| | | | 700/300 |
| 2016/0378149 A1 * | 12/2016 | Kam | G06F 1/3206 |
| | | | 713/320 |
| 2017/0269653 A1 * | 9/2017 | Shabbir | H05K 7/20727 |
| 2017/0269654 A1 * | 9/2017 | Shabbir | G06F 13/4018 |
| 2017/0318707 A1 * | 11/2017 | Shabbir | H05K 7/20836 |

(Continued)

FOREIGN PATENT DOCUMENTS

| | | | | |
|---|---|---|---|---|
| CN | 110096233 A | * | 8/2019 | .......... G06F 11/3037 |
| DE | 102008054598 A1 | * | 8/2010 | ............. G06F 1/206 |

(Continued)

*Primary Examiner* — Christopher D Birkhimer
(74) *Attorney, Agent, or Firm* — Canon U.S.A., Inc. IP Division

(57) ABSTRACT

A control apparatus to control a solid state drive having a thermal throttling function includes a controller. The controller performs control to activate the thermal throttling function of the solid state drive at a first temperature from startup of the control apparatus to startup completion. The controller also performs control to activate the thermal throttling function of the solid state drive at a second temperature that is lower than the first temperature after the startup completion of the control apparatus.

13 Claims, 6 Drawing Sheets

(56) References Cited

U.S. PATENT DOCUMENTS

| | | | | |
|---|---|---|---|---|
| 2018/0232021 A1* | 8/2018 | Perchlik | .................. | G06F 1/206 |
| 2020/0081507 A1* | 3/2020 | Nowell | .................... | G11C 7/04 |
| 2020/0213468 A1* | 7/2020 | Ito | ...................... | H04N 1/00034 |
| 2020/0350229 A1* | 11/2020 | Chang | ................. | H01L 23/3733 |
| 2021/0080500 A1* | 3/2021 | Braunisch | ........... | H01L 23/5384 |
| 2022/0012150 A1* | 1/2022 | Panse | .................. | G06F 11/3058 |
| 2023/0066696 A1* | 3/2023 | Taira | ..................... | G11C 5/147 |

FOREIGN PATENT DOCUMENTS

| | | | | |
|---|---|---|---|---|
| ES | 2748596 T3 * | 3/2020 | ............ | G06F 1/206 |
| JP | 2009-157829 A | 7/2009 | | |

* cited by examiner

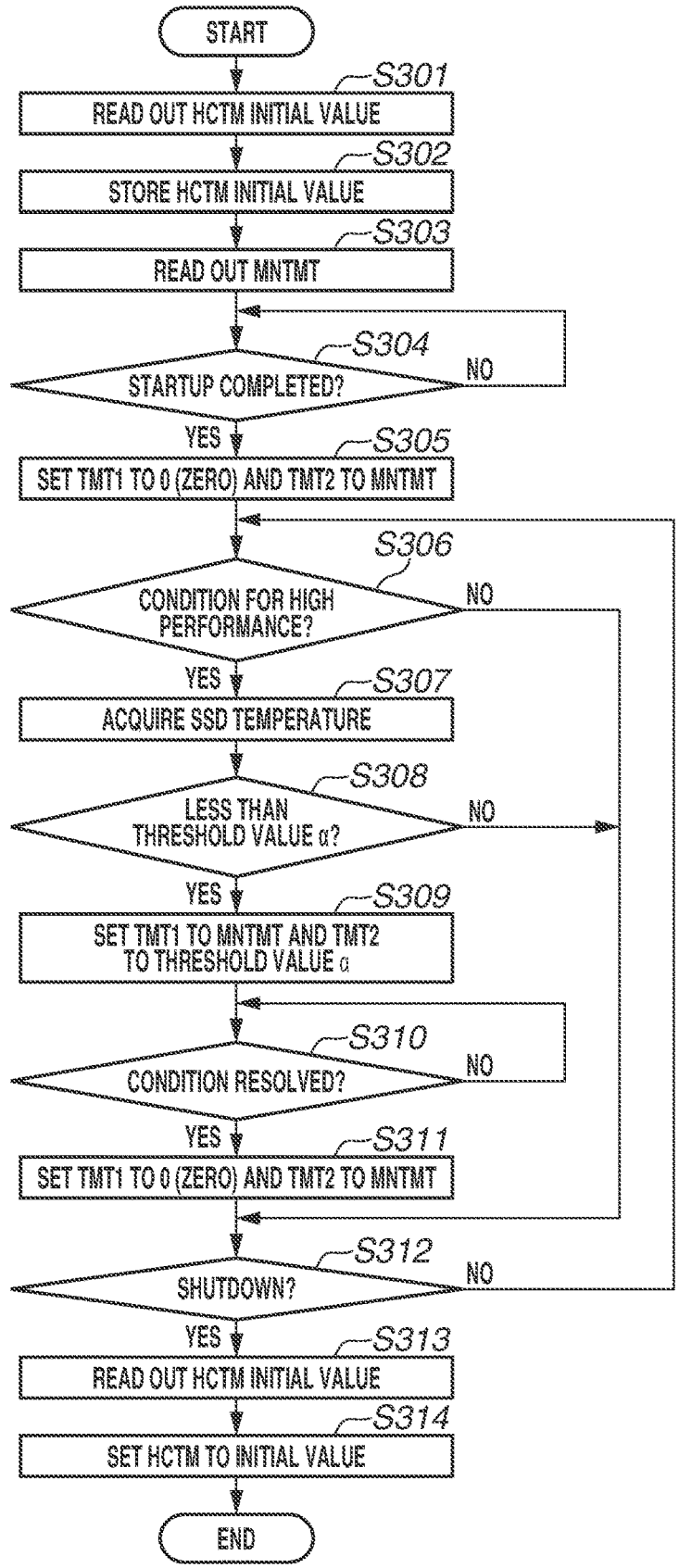

CONTROL APPARATUS TO ACHIEVE PERFORMANCE WHILE LOWERING TEMPERATURE OF A SOLID STATE DRIVE

BACKGROUND

Field

The present disclosure relates to a control apparatus, a control method for the control apparatus, and a storage medium.

Description of the Related Art

Image forming apparatuses are equipped with large capacity storage devices such as a hard disk drive (HDD) and a solid state drive (SSD). The large capacity storage devices store operation programs, and also allow implementation of a storage function of storing and editing image data.

Compared with HDDs, SSDs provide high-speed random access with low power consumption, high impact resistance, light weight, and space saving. Particularly, without the requirement of initial operations such as spin-up at HDDs at system startup, SSDs are very effective in shortening startup time and recovery time with high-speed data transfer. Thus, more and more HDDs are being replaced with SSDs as storage devices of image forming apparatuses.

The recent mainstream of SSD connection interfaces on personal computers has been changing from the Serial Advanced Technology Attachment (SATA) interface to the Non-Volatile Memory Express (hereinafter, referred to as NVMe) interface with Peripheral Component Interconnect Express (PCIe) connection.

An NVMe interface is optimized for a flash storage using a non-volatile memory such as an SSD and supports a transfer rate up to 40 Gbps, which is about seven times faster than the transfer rate of a SATA interface in terms of theoretical values.

NVMe SSDs on the market transfer data at least twice faster than SATA SSDs do, and have a transfer rate of one gigabyte or more per second, some models of which have a transfer rate of three gigabytes per second.

Further, NVMe SSDs use a very compact housing similar to that of SATA SSDs, due to the direct connection to a mother board via a card edge connector like a dynamic random access memory (DRAM) module called an M.2 connector.

However, an NVMe SSD provides a dramatically higher transfer rate, but on the other hand, it has a disadvantage of very high self-heating. It is not uncommon for NVMe SSDs to exceed a self-heated temperature of 90° C. Thus, an NVMe SSD has a thermal throttling function of monitoring its own temperature and reducing its processing capacity in response to the temperature exceeding a predetermined threshold value, allowing reduction of self-heat generation. An NVMe SSD offers a very high data transfer rate, and can maintain a transfer rate of 100 to 400 megabytes or more per second, even if its performance is lowered by the thermal throttling function. Japanese Patent Application Laid-Open No. 2009-157829 discusses a configuration for implementing a thermal throttling function.

In an image forming apparatus, the control board with an NVMe SSD includes heat-sensitive components such as capacitors mounted on it, along with high self-heating components such as a central processing unit (CPU) and an image processing application specific integrated circuit (ASIC). Further, the system box in which the control board is installed has no fan in order to reduce noise and cost, a demand in recent years, which is apt to stay of heat in it.

Conventional storages installed in image forming apparatuses have been SATA-interface SSDs, which cause little self-heating. The heating sources include a CPU and an image processing ASIC, and based on them the heat design of a system box has been performed.

An SSD that has an NVMe specification, which causes a self-heating equal to or more than that of an CPU, adds the amount of heating from the SSD itself, which may cause the temperature in the system box to increase more than its tolerance limit to damage heat-sensitive components on the control board. Thus, an NVMe SSD includes a large heat sink or fan as heating countermeasure, increasing the cost.

SUMMARY

The present disclosure is directed to providing a control apparatus to control a solid state drive having a thermal throttling function that works towards addressing a demand for an NVMe SSD with reduced heating used in an image forming apparatus.

According to an aspect of the present disclosure, a control apparatus to control a solid state drive having a thermal throttling function includes a controller configured to perform control to activate the thermal throttling function of the solid state drive at a first temperature from startup of the control apparatus to startup completion and to activate the thermal throttling function of the solid state drive at a second temperature that is lower than the first temperature after the startup completion of the control apparatus.

Further features of the present disclosure will become apparent from the following description of exemplary embodiments with reference to the attached drawings.

BRIEF DESCRIPTION OF THE DRAWINGS

FIG. 6 is a flowchart illustrating a control method for the controller unit.

DESCRIPTION OF THE EMBODIMENTS

An example of a control apparatus according to a first exemplary embodiment will be described with reference to the attached drawings. Components described in the present exemplary embodiment are mere examples, and other components may be included.

Figure 1:
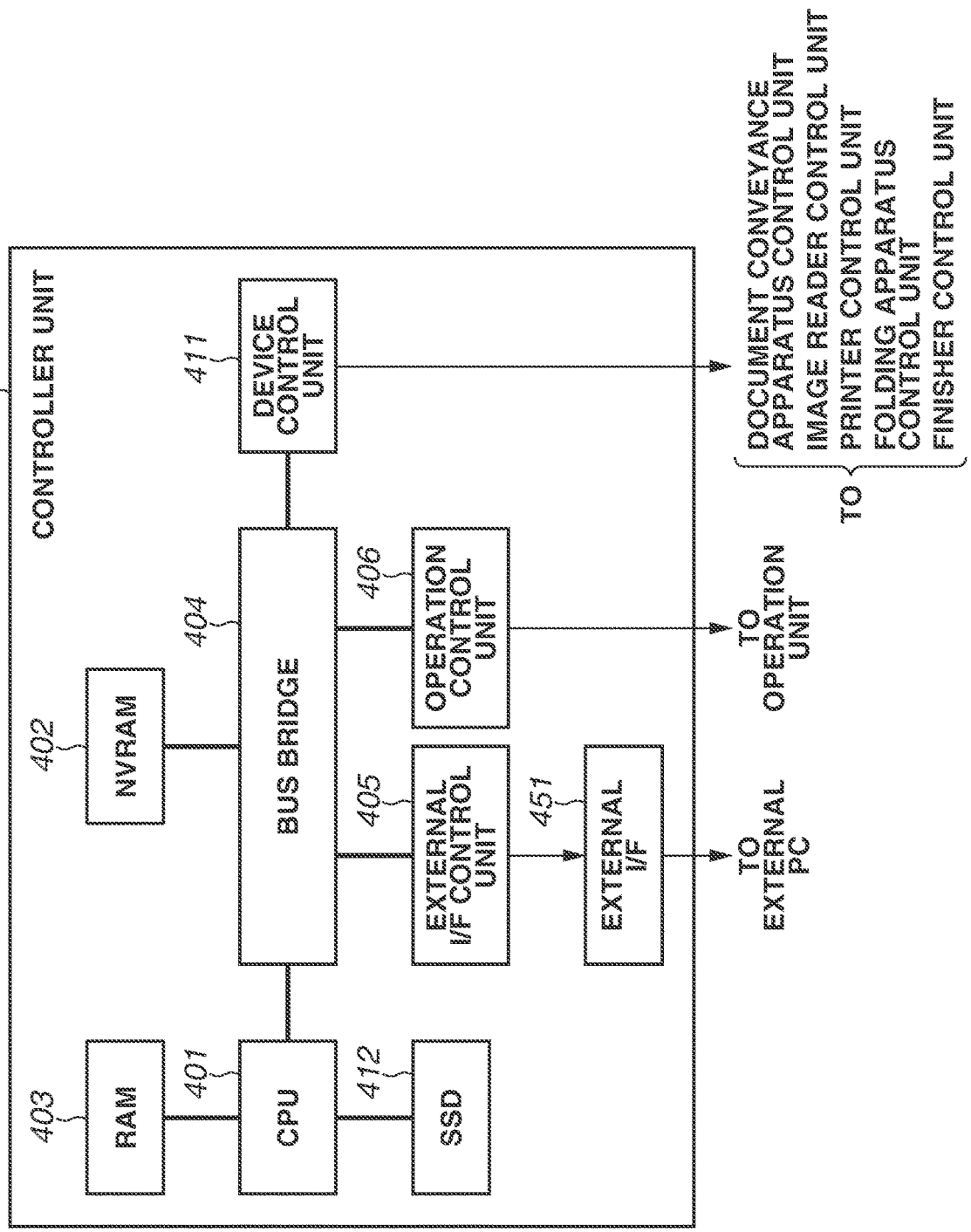
FIG. 1 is a block diagram illustrating a configuration example of a controller unit.

FIG. 1 is a block diagram illustrating a configuration example of a controller unit 400 in an image forming apparatus. The controller unit 400 is an example of a control apparatus. The controller unit 400 communicates with a document conveyance apparatus control unit that controls a document conveyance apparatus and an image reader control unit that controls an image reader based on instructions from an operation unit and an external personal computer and acquires image data on a document to be input. The controller unit 400 also communicates with a printer control unit that controls a printer unit and prints the image data on a sheet. The controller unit 400 further communicates with a folding apparatus control unit that controls a folding apparatus and a finisher control unit that controls a finisher and performs a desired output such as stapling and a punch hole on the printed sheet.

The controller unit 400 includes a central processing unit (CPU) 401, a non-volatile random access memory (RAM) 402, a RAM 403, a bus bridge 404, an external interface (I/F) control unit 405, an operation control unit 406, a device control unit 411, a solid state drive (SSD) 412, and an external I/F 451.

The external I/F 451 is an interface connected to an external personal computer, for example, using an external bus such as a network and a Universal Serial Bus (USB) to receive print data from the external personal computer and to transmit image data in the SSD 412 described below to the external personal computer. The device control unit 411 can rasterize the print data received by the external I/F 451 into an image and control the printer unit to print the image.

The CPU 401 is connected to the bus bridge 404 and reads an initial startup program for the CPU 401 from the non-volatile RAM 402 via the bus bridge 404. The CPU 401 performs control on an operating system (hereinafter, referred to as the OS).

The CPU 401 is also directly connected to the RAM 403 and the SSD 412, which are used as work areas for calculation associated with control. The RAM 403 is connected to a memory controller in the CPU 401. The SSD 412 is connected to the CPU 401 by Peripheral Component Interconnect Express (PCIe) connection via an M.2 connector.

The SSD 412 stores main programs including the OS for the CPU 401, image data acquired from the image reader and the external I/F 451, image data edited by the operation unit, and application programs. The SSD 412 also stores user preference data.

The external I/F control unit 405, the operation control unit 406, and the device control unit 411 are connected to the bus bridge 404. The external I/F control unit 405 controls the external I/F 451. The external I/F 451 includes a network interface and a USB interface. The operation control unit 406 controls the operation unit. The device control unit 411 is connected to the document conveyance apparatus control unit, the image reader control unit, the printer control unit, the folding apparatus control unit, and the finisher control unit, and controls these units.

Figure 2:
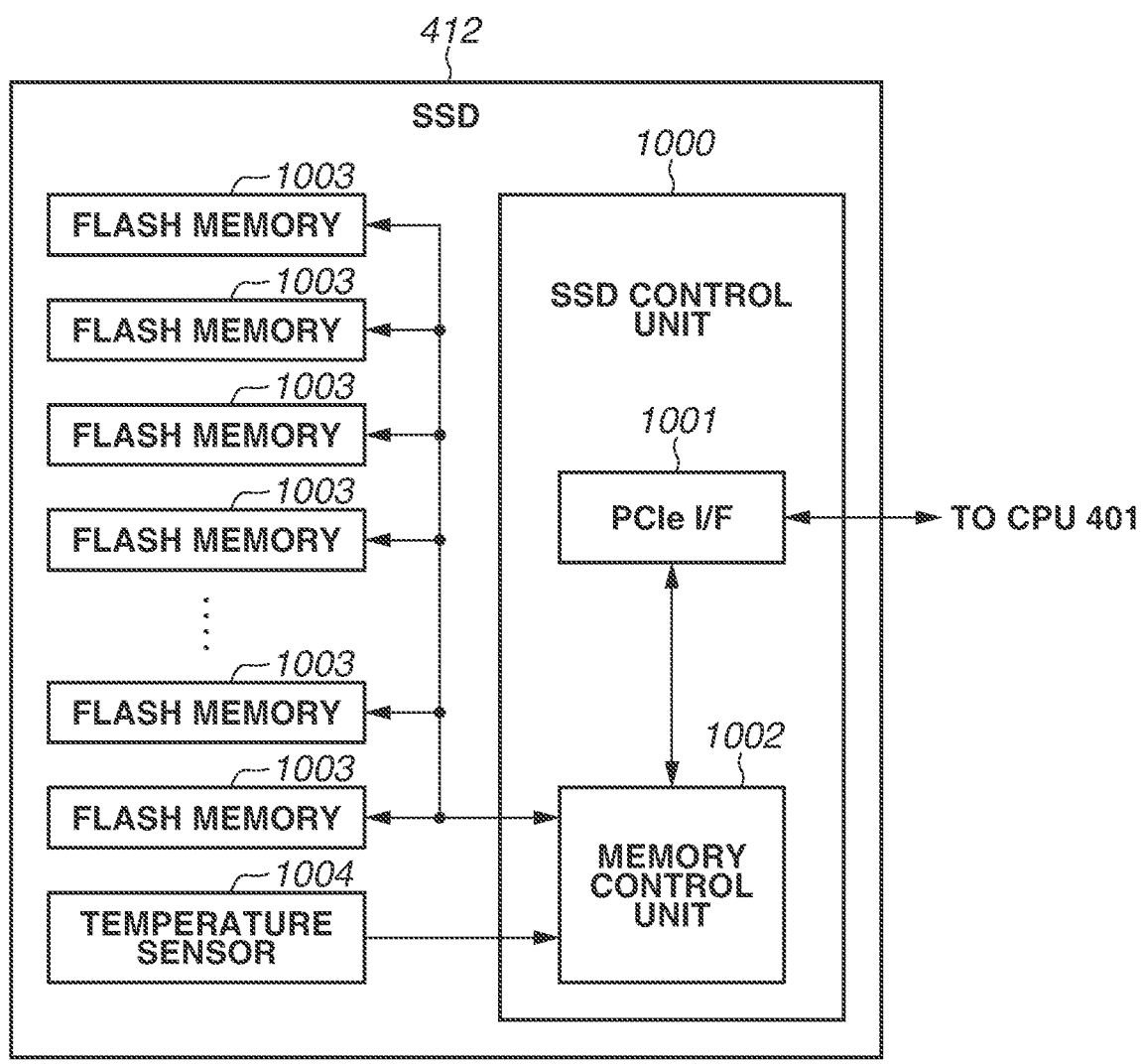
FIG. 2 is a block diagram illustrating a configuration example of a solid state drive (SSD) with a Non-Volatile Memory Express (NVMe) specification.

FIG. 2 is a block diagram illustrating a configuration example of the SSD 412 in FIG. 1. The SSD 412 is an SSD with a Non-Volatile Memory Express (NVMe) specification. The SSD 412 includes an SSD control unit 1000, a plurality of flash memories 1003, and a temperature sensor 1004. The SSD control unit 1000 includes a PCIe I/F 1001 and a memory control unit 1002. Each flash memory 1003 is a non-volatile memory and can store programs and image data. The temperature sensor 1004 detects the temperature of the SSD 412. The PCIe I/F 1001 is an interface for connecting the memory control unit 1002 and the CPU 401. The memory control unit 1002 controls writing and reading to each flash memory 1003 and inputs and outputs write and read data to and from the CPU 401. Further, the memory control unit 1002 outputs the temperature detected by the temperature sensor 1004 to the CPU 401.

The PCIe I/F 1001 is an NVMe interface by the PCIe connection, is optimized for the flash memories 1003, and supports a transfer rate up to 40 Gbps.

The SSD 412 with the NVMe specification is very compact as it is connected to the CPU 401 via a card edge connector called an M.2 connector. The SSD 412 with the NVMe specification has a high transfer rate, but on the other hand, it generates very high self-heating. The SSD 412 with the NVMe specification has a thermal throttling function of monitoring its own temperature and reducing its processing capacity in response to a temperature exceeding a predetermined threshold value, allowing reduction of self-heating in order to prevent self-damage due to self-heating.

The following is a description of the thermal throttling function of the SSD 412 with the NVMe specification. The SSD 412 includes the temperature sensor 1004 in order to control its own temperature.

FIG. 2 illustrates an example including one temperature sensor 1004, but a plurality of temperature sensors may be provided. The CPU 401 can confirm temperature information detected by the temperature sensor 1004 through Self-Monitoring, Analysis and Reporting Technology (SMART) information.

The thermal throttling function is controlled with a host controlled thermal management (HCTM) setting in a Feature command. Temperatures are handled in the HCTM in Kelvin (K) units, not Celsius (° C.).

The SSD 412 activates throttling based on its own temperature information acquired from the temperature sensor 1004 and temperatures set to a thermal management temperature 1 (TMT1) and a thermal management temperature 2 (TMT2) in the HCTM setting. A Feature identification (ID) of the HCTM is 0x10.

Limit values settable in the TMT1 and the TMT2 are defined by a minimum TMT (MNTMT) (lower limit) and a maximum TMT (MXTMT) (upper limit) of Identify Data Structures. The MNTMT and the MXTMT are device-specific values of the SSD 412.

Throttling activated at the temperature set in the TMT1 is weak, which reduces heat generation along with a minimum impact on the performance. Further, throttling activated at the temperature set in the TMT2 is strong, which gives priority to reduction of the heat generation without taking into account the impact on the performance. A magnitude relationship among the parameters is as follows.

$$MNTMT \leq TMT1 < TMT2 \leq MXTMT$$

If both the TMT1 and the TMT2 are 0 (zero), throttling is disabled (an OFF state). The SSD 412 comes in two types of devices: one supports both the TMT1 and the TMT2, and the other the TMT2 alone.

Next, a method will be described of controlling a temperature reduction mode using the thermal throttling function of the SSD 412 with the NVMe specification mounted on the controller unit 400 according to the first exemplary embodiment. Temperatures that activate thermal throttling are normally 75 to 85° C.

According to the present exemplary embodiment, an example will be described where the SSD 412 with the NVMe specification has a configuration with an initial setting of 0 (disabled) of the TMT1, an initial setting of 85° C. of the TMT2, and 50° C. of the MNTMT. As described above, temperatures are handled in the HCTM in Kelvin units, and thus the above-described values are as follows: the TMT1 is 273 K, the TMT2 is 358 K, and the MNTMT is 323 K.

Figure 3:
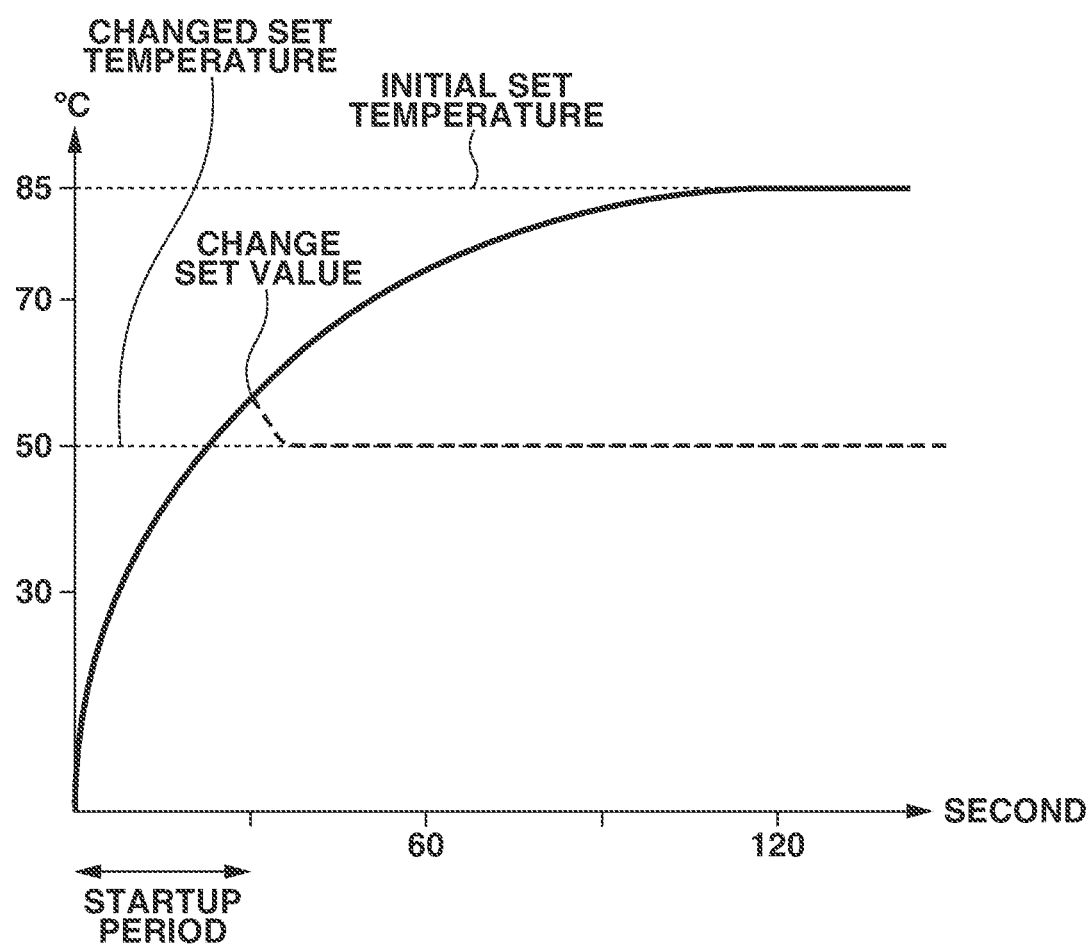
FIG. 3 illustrates temperatures of the SSD.

If the SSD 412 with the NVMe specification is used in the default state at shipment from the factory, the temperature of the SSD 412 reaches a throttling activation temperature in about two minutes as illustrated in the solid line in the graph in FIG. 3. The temperature then levels off going up and down near the initial set temperature (85° C.) by throttling. The controller unit 400 of the image forming apparatus has a data transfer rate of 100 to 200 megabytes/second to the SSD 412 in carrying out jobs such as printing and image scanning. On the other hand, it is suitable that data transfer rates at startup and shutdown of the system of the controller unit 400 are as high as possible because it will take shorter to perform the startup and shutdown with higher data transfer rates.

The controller unit 400 is a control apparatus that controls the SSD 412 with the thermal throttling function. The controller unit 400 operates the SSD 412 in the normal mode at startup, changes the activation temperature setting of throttling to a value lower than the initial set value after confirming the startup, which sets the SSD 412 in a throttling activation state at all times, and operates the SSD 412 in the temperature reduction mode. That allows the controller unit 400 to achieve temperature reduction while to keep the performance of the SSD 412. Here, an example will be described where the activation temperature setting of thermal throttling is set to a settable minimum value (the MNTMT) of the SSD 412, at which throttling is most likely to be activated.

FIG. 3 is the graph illustrating a case where the MNTMT of the SSD 412 is 323 K (50° C.). The solid line in FIG. 3 indicates the temperature of the SSD 412 in the normal mode, and the TMT2 is set to the initial set temperature (85° C.). The dashed line in FIG. 3 indicates temperatures of the SSD 412 in the temperature reduction mode in which the TMT2 is changed to the MNTMT (50° C.). The CPU 401 operates the SSD 412 in the normal mode with the TMT2 set to the initial set temperature (85° C.) during the startup period. After the startup period, the CPU 401 operates the SSD 412 in the temperature reduction mode with the TMT2 set to the MNTMT (50° C.). The temperature of the SSD 412 is kept going up and down near the TMT2 (50° C.) by throttling. The SSD 412 maintains the performance in the normal mode during the startup period and lowers the temperature in the temperature reduction mode after the startup period. Further, in response to a detection of a shutdown of the system, the CPU 401 returns the activation temperature setting of thermal throttling to the normal mode to write back data in the shutdown, improving the performance and completing preparation for next startup.

Figure 4:
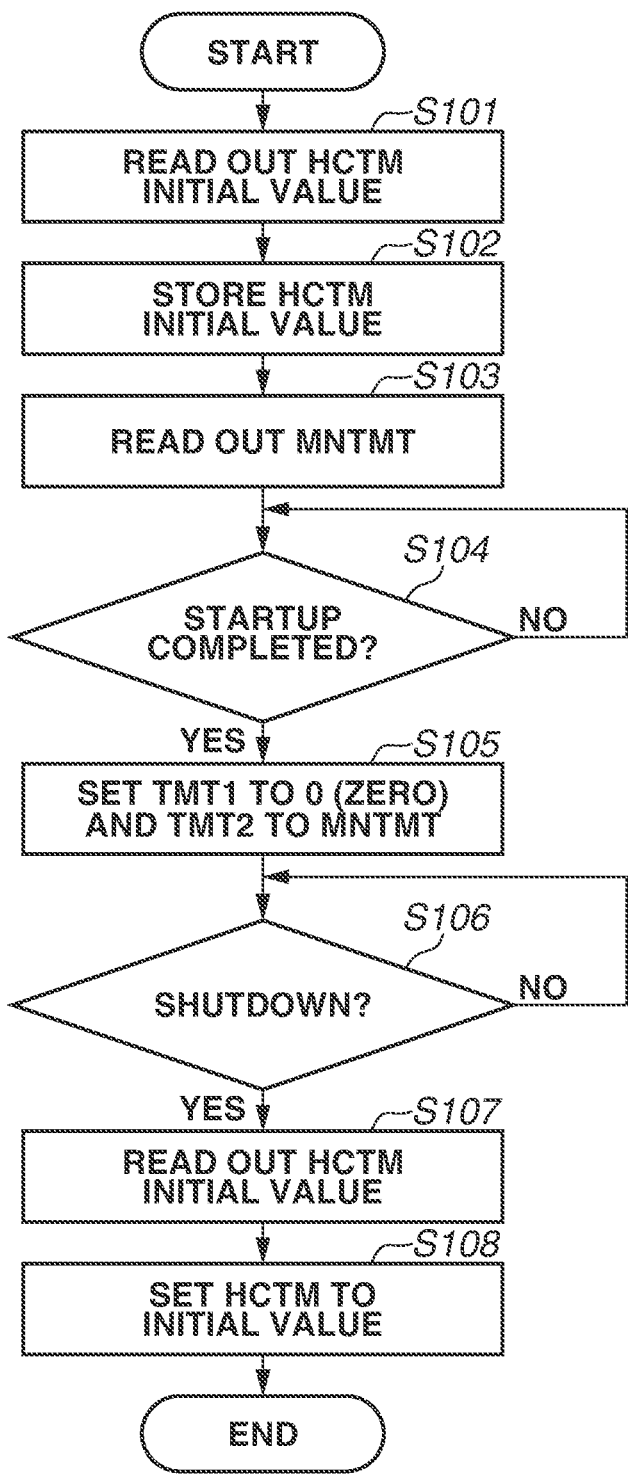
FIG. 4 is a flowchart illustrating a control method for the controller unit.

FIG. 4 is a flowchart illustrating a control method for the controller unit 400 according to the first exemplary embodiment. If the controller unit 400 is energized at system startup, the CPU 401 checks the connection of each device in order to perform initialization. In checking the connection of each device, the CPU 401 starts the processing in a flowchart in FIG. 4 starting with a check of the connection of the SSD 412.

In step S101, the CPU 401 accesses the SSD 412 and reads out the initial set values of the TMT1 and the TMT2 of the HCTM in the Feature command. The initial set values of the TMT1 and the TMT2 are 0 (disabled) and 358 K (85° C.), respectively.

When the temperature of the SSD 412 rises and reaches the TMT2 (85° C.), the SSD 412 activates a high thermal throttling and lowers the performance significantly to reduce the heat generation.

In step S102, the CPU 401 stores the initial set values of the TMT1 and the TMT2 read out in step S101 in the non-volatile RAM 402 or the SSD 412.

In step S103, the CPU 401 accesses the SSD 412 and reads out the value of the MNTMT of the Identify Data Structures. The MNTMT is, for example, 323 K (50° C.).

In step S104, the CPU 401 determines whether the startup of the system is completed. As a method of determining completion of the startup of the system with the operation system (the OS) provided with a startup completion flag indicating completion of startup, the CPU 401 monitors the startup completion flag and determines that the startup of the system is completed if the startup completion flag is set. Further, with a timer for counting from the start of energization of the controller unit 400, the CPU 401 determines that the startup of the system is completed if the count value reaches a predetermined value set in advance. The CPU 401 waits until the startup of the system is completed, and if the startup of the system is completed (YES in step S104), the CPU 401 advances the processing to step S105.

In step S105, the CPU 401 sets the TMT1 to 0 (zero) and the TMT2 to the value of the MNTMT (for example, 323 K (50° C.)) of the SSD 412 through "Set Feature". The MNTMT (50° C.) is lower than the initial set value of the TMT2 (85° C.).

Under the condition, when the temperature of the SSD 412 rises and reaches the TMT2 (50° C.), the SSD 412 activates the high thermal throttling and lower the performance significantly to reduce the heat generation.

In step S106, the CPU 401 determines whether an issuance of a system shutdown command is detected. The CPU 401 waits until an issuance of the system shutdown command is detected, and if an issuance of the system shutdown command is detected (YES in step S106), the CPU 401 advances the processing to step S107.

In step S107, the CPU 401 reads out the initial set values of the TMT1 and the TMT2 of the HCTM stored in step S102 from the non-volatile RAM 402 or the SSD 412 as a storage destination.

In step S108, the CPU 401 sets the initial set values of the TMT1 and the TMT2 of the HCTM read out from the SSD 412 through "Set Feature". For example, the initial set values of the TMT1 and the TMT2 are 0 and 358 K (85° C.), respectively.

Under the condition, when the temperature of the SSD 412 rises and reaches the TMT2 (85° C.), the SSD 412 activates the high thermal throttling and lower the performance significantly to reduce the heat generation.

As described above, the CPU 401 performs control to activate the thermal throttling function of the SSD 412 at the temperature of the initial set value of the TMT2 (85° C.) from the startup to the startup completion of the controller unit 400. Further, the CPU 401 performs control to activate the thermal throttling function of the SSD 412 at the temperature of the MNTMT after the startup completion of the controller unit 400. The MNTMT is a settable minimum value.

From the startup to the startup completion of the controller unit 400, the SSD 412 lowers the performance to reduce the heat generation when the temperature of the SSD 412 rises and reaches the initial set value of the TMT2 (85° C.). After the startup completion of the controller unit 400, the SSD 412 lowers the performance to reduce the heat generation when the temperature of the SSD 412 rises and reaches the temperature of the MNTMT.

The CPU 401 sets the thermal throttling function of the SSD 412 to be activated at the temperature of the initial set value of the TMT2 (85° C.) in response to a detection of the issuance of the system shutdown command.

According to the present exemplary embodiment, the CPU 401 maintains the initial set values of the TMT1 and the TMT2 of the SSD 412 before the startup completion of the system and maintains a high performance function of the SSD 412 by operating the SSD 412 in the normal mode. After the startup completion of the system, the CPU 401 sets the TMT2 to the MNTMT of the SSD 412 and lowers the temperature of the SSD 412 by operating the SSD 412 in the temperature reduction mode. After the startup of the system, the thermal throttling is always activated to lower the temperature, which entails minimum configurations of a heat sink and a fan, reducing costs.

As described above, the CPU 401 operates the SSD 412 in the normal mode before the startup completion and after the issuance of the shutdown command, in which the SSD 412 operates the maximum of the operations of the controller unit 400 of the image forming apparatus. The CPU 401 also operates the SSD 412 in the temperature reduction mode during the period from the startup completion to the issuance of the shutdown command. Thus, the controller unit 400 can keep the performance of the SSD 412 while lower the temperature of the SSD 412.

A second exemplary embodiment will be described. According to the second exemplary embodiment, if the temperature is less than a threshold value, the SSD 412 is temporarily returned in the normal mode to improve the performance for short-time processing for a high transfer rate such as startup or installation of an application during the temperature reduction mode.

Figure 5:
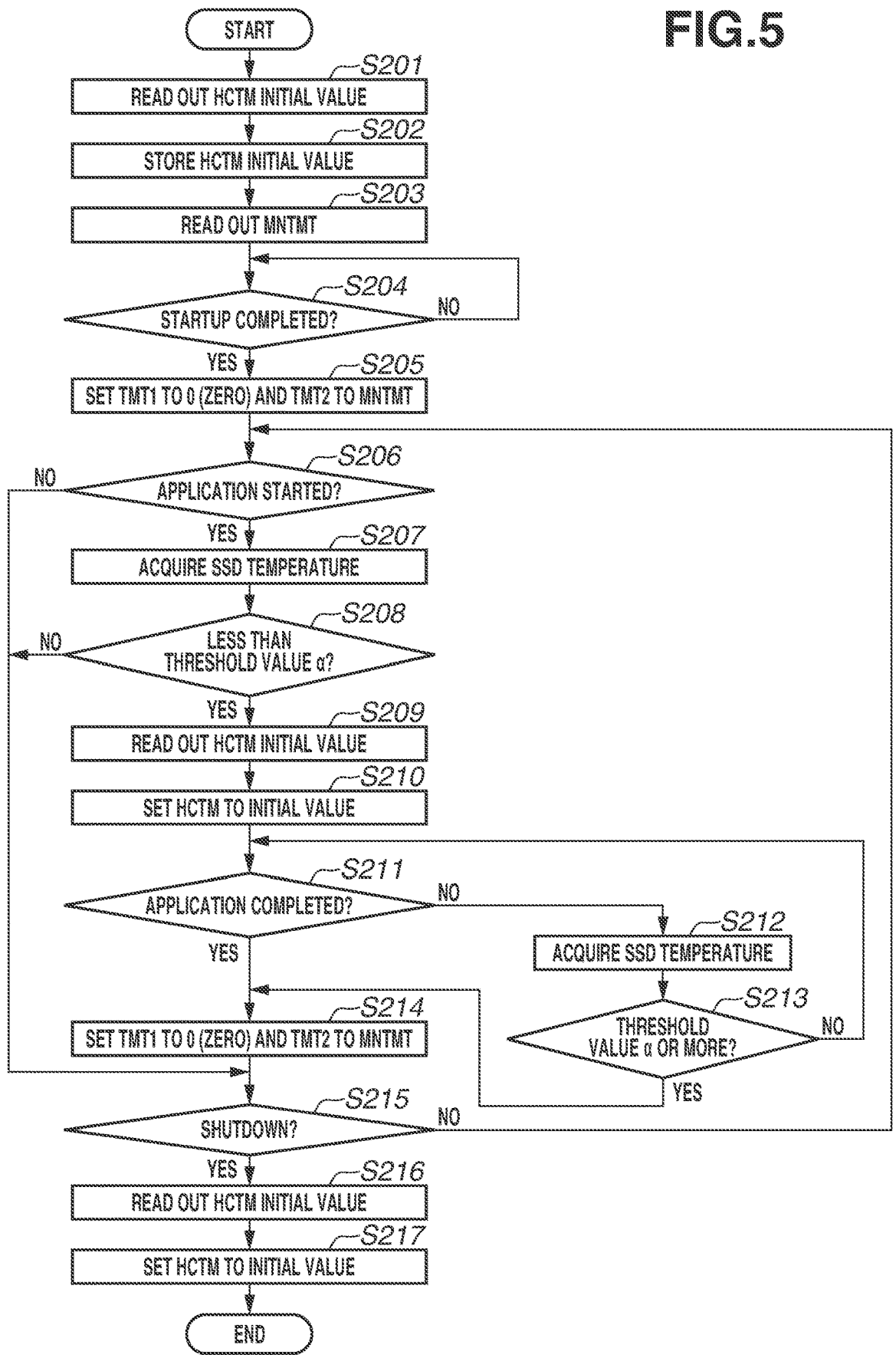
FIG. 5 is a flowchart illustrating a control method for the controller unit.

FIG. 5 is a flowchart illustrating a control method for the controller unit 400 according to the second exemplary embodiment. First, in steps S201 to S205, the CPU 401 performs processing similar to the processing in steps S101 to S105 in FIG. 4.

Next, in step S206, the CPU 401 determines whether a request for startup of an application or a request for installation of an application is detected through operations performed by a user on the operation unit. If a request for startup of an application or a request for installation of an application is detected (YES in step S206), the CPU 401 advances the processing to step S207. Otherwise (NO in step S206), the CPU 401 advances the processing to step S215.

In step S207, the CPU 401 accesses the SSD 412 and acquires the temperature of the SSD 412 detected by the temperature sensor 1004. Information about the current temperature of the SSD 412 with the NVMe specification is included in the SMART information. The CPU 401 acquires the temperature of the SSD 412 by issuing a "Get Log Page" command. The Log Page ID of the SMART information is 02h. The temperature of the SSD 412 to be acquired is in Kelvin (K) units.

In step S208, the CPU 401 determines whether the temperature of the SSD 412 acquired in step S207 is less than a threshold value a. The threshold value a differs depending on the system box of the image forming apparatus, but is set based on the temperature characteristics of components to be mounted on the control board mounted on the system box. If the temperature of the SSD 412 is less than the threshold value a (YES in step S208), the CPU 401 advances the processing to step S209. Otherwise (NO in step S208), the CPU 401 advances the processing to step S215.

In step S209, the CPU 401 reads out the initial set values of the TMT1 and the TMT2 of the HCTM stored in step S202 from the non-volatile RAM 402 or the SSD 412 as the storage destination.

In step S210, the CPU 401 sets the initial set values of the TMT1 and the TMT2 of the HCTM read out through "Set Feature" for the SSD 412. For example, the initial set values of the TMT1 and the TMT2 are 0 and 358 K (85° C.), respectively.

Under the condition, when the temperature of the SSD 412 rises and reaches the TMT2 (85° C.), the SSD 412 activates the high thermal throttling and lowers the performance significantly to reduce the heat generation.

In step S211, the CPU 401 determines whether completion of startup of the application or completion of installation of the application is detected. If the completion of startup of the application or the completion of installation of the application is detected (YES in step S211), the CPU 401 advances the processing to step S214. Otherwise (NO in step S211), the CPU 401 advances the processing to step S212.

In step S212, the CPU 401 accesses the SSD 412 and acquires the temperature of the SSD 412 detected by the temperature sensor 1004.

In step S213, the CPU 401 determines whether the temperature of the SSD 412 acquired in step S212 is the threshold value a or higher. If the temperature of the SSD 412 is the threshold value a or higher (YES in step S213), the CPU 401 advances the processing to step S214. Otherwise (NO in step S213), the CPU 401 returns the processing to step S211.

In step S214, the CPU 401 sets the TMT1 to 0 (zero) and the TMT2 to the value of the MNTMT (for example, 323 K (50° C.)) of the SSD 412 through "Set Feature".

Under the condition, when the temperature of the SSD 412 rises and reaches the TMT2 (50° C.), the SSD 412 activates the high thermal throttling and lowers the performance significantly to reduce the heat generation.

In step S215, the CPU 401 determines whether an issuance of a system shutdown command is detected. If an issuance of the system shutdown command is not detected (NO in step S215), the CPU 401 returns the processing to step S206. If an issuance of the system shutdown command is detected (YES in step S215), the CPU 401 advances the processing to step S216.

In step S216, the CPU 401 reads out the initial set values of the TMT1 and the TMT2 of the HCTM stored in step S202 from the non-volatile RAM 402 or the SSD 412 as the storage destination.

In step S217, the CPU 401 sets the initial set values of the TMT1 and the TMT2 of the HCTM read out through "Set Feature" for the SSD 412. For example, the initial set values of the TMT1 and the TMT2 are 0 and 358 K (85° C.), respectively.

Under the condition, when the temperature of the SSD 412 rises and reaches the TMT2 (85° C.), the SSD 412 activates the high thermal throttling and lowers the performance significantly to reduce the heat generation.

As described above, in step S206, if a request for startup of an application or a request for installation of an application is detected (YES in step S206), the CPU 401 advances the processing to step S207. In step S208, if the temperature of the SSD 412 is less than a threshold value (YES in step S208), the CPU 401 advances the processing to step S209. In step S210, the CPU 401 performs control to activate the thermal throttling function of the SSD 412 at the initial set value of the TMT2 (85° C.).

In step S211, if the completion of startup of the application or the completion of installation of the application is detected (YES in step S211), the CPU 401 advances the processing to step S214. In step S213, if the temperature of the SSD 412 reaches the threshold value or higher (YES in step S213), the CPU 401 advances the processing to step S214. In step S214, the CPU 401 performs control to activate the thermal throttling function of the SSD 412 at the temperature of the MNTMT (50° C.).

As described above, according to the present exemplary embodiment, in response to the satisfaction of the conditions in steps S206 and S208 in the temperature reduction mode, the controller unit 400 temporarily returns the SSD 412 in the normal mode for the original throughput of the SSD 412. That allows the controller unit 400 to achieve the performance while to lower the temperature of the SSD 412.

A third exemplary embodiment will be described. According to the third exemplary embodiment, with the SSD 412 supporting both high throttling and low throttling, the CPU 401 dynamically switches between the levels of throttling based on the operation mode and the temperature. The SSD 412 supports the levels of throttling, operates in the normal mode at startup and shutdown of the system, and operates in a first temperature reduction mode in which the high throttling is always activated after the startup until an issuance of the shutdown command.

If the condition for the high performance of the SSD 412 is satisfied and the temperature of the SSD 412 is less than the threshold value a, the SSD 412 operates in a second temperature reduction mode.

The condition for the high performance is one of the following conditions.

At the time when startup of an application is requested.
At the time when installation of an application is requested.
At the time when a plurality of jobs conflicts (for example, simultaneous operations of printing and image scanning, etc.)

According to the present exemplary embodiment, an example will be described of the SSD 412 with the NVMe specification, of which initial set values of the TMT1 and the TMT2 are 75° C. and 85° C., respectively, the MNTMT is 50° C., and a threshold value a is 60° C. As described above, the temperature handled in the HCTM is in Kelvin (k) units, and hence the above-described values are as follows: the TMT1 is 348 K, the TMT2 is 358 K, the MNTMT is 323 K, and the threshold value a is 333 K.

FIG. 6 is a flowchart illustrating a control method for the controller unit 400 according to the third exemplary embodiment. First, in steps S301 to S305, the CPU 401 performs processing similar to the processing in steps S101 to S105 in FIG. 4.

Next, in step S306, the CPU 401 determines whether the condition for the high performance of the SSD 412 is satisfied. The condition for the high performance of the SSD 412 is a request for startup of an application, a request for installation of an application, or conflict of a plurality of jobs (for example, simultaneous operations of printing and image scanning, etc.). If the condition for the high performance of the SSD 412 is satisfied (YES in step S306), the CPU 401 advances the processing to step S307. Otherwise (NO in step S306), the CPU 401 advances the processing to step S312.

In step S307, the CPU 401 accesses the SSD 412 by issuing a "Get Log Page" command and acquires the temperature of the SSD 412 detected by the temperature sensor 1004.

In step S308, the CPU 401 determines whether the temperature of the SSD 412 acquired in step S307 is less than the threshold value a. If the temperature of the SSD 412 is less than the threshold value a (YES in step S308), the CPU 401 advances the processing to step S309. Otherwise (NO in step S308), the CPU 401 advances the processing to step S312.

In step S309, the CPU 401 sets the TMT1 to the value of the MNTMT read out in step S303 and the TMT2 to the threshold value a through "Set Feature" for the SSD 412. The temperature of the MNTMT is 323 K (50° C.). The threshold value a is 333 K (60° C.) and is a temperature higher than the MNTMT.

Under the condition, when the temperature of the SSD 412 rises and reaches the TMT1 (50° C.), the SSD 412 activates low thermal throttling and lowers the performance slightly to reduce the heat generation. Even then, if the temperature of the SSD 412 does not drop and reaches the TMT2 (60° C.), the SSD 412 activates the high thermal throttling and lowers the performance significantly to reduce the heat generation.

In step S310, the CPU 401 waits until the above-described condition for the high performance of the SSD 412 is not satisfied, and if the condition for the high performance of the SSD 412 is not satisfied (NO in step S310), the CPU 401 advances the processing to step S311. For example, if the completion of startup of an application, the completion of installation of an application, or termination of conflict of a plurality of jobs is detected (YES in step S310), the CPU 401 advances the processing to step S311.

In step S311, the CPU 401 sets the TMT1 to 0 (zero) and the TMT2 to the value of the MNTMT (for example, 323 K (50° C.)) through "Set Feature" for the SSD 412.

Under the condition, if the temperature of the SSD 412 rises and reaches the TMT2 (50° C.), the SSD 412 activates the high thermal throttling and lowers the performance significantly to reduce the heat generation.

In step S312, the CPU 401 determines whether an issuance of a system shutdown command is detected. If an issuance of a system shutdown command is not detected (NO in step S312), the CPU 401 returns the processing to step S306. If an issuance of a system shutdown command is detected (YES in step S312), the CPU 401 advances the processing to step S313.

In step S313, the CPU 401 reads out the initial set values of the TMT1 and the TMT2 of the HCTM stored in step S302 from the non-volatile RAM 402 or the SSD 412 as the storage destination.

In step S314, the CPU 401 sets the initial set values of the TMT1 and the TMT2 of the HCTM read out through "Set Feature" for the SSD 412. For example, the initial set values of the TMT1 and the TMT2 are 0 and 358 K (85° C.), respectively.

Under the condition, if the temperature of the SSD 412 rises and reaches the TMT2 (85° C.), the SSD 412 activates the high thermal throttling and lowers the performance significantly to reduce the heat generation.

As described above, in step S306, if a request for startup of an application, a request for installation of an application, or conflict of a plurality of jobs is detected (YES in step S306), the CPU 401 advances the processing to step S307. In step S308, if the temperature of the SSD 412 is less than the threshold value a (YES in step S308), the CPU 401 advances the processing to step S309. In step S309, the CPU 401 performs control to activate the low thermal throttling function of the SSD 412 at the temperature of the MNTMT (50° C.) and to activate the high thermal throttling function of the SSD 412 at the temperature of the threshold value a. Under the condition, if the temperature of the SSD 412 rises and reaches the temperature of the MNTMT (50° C.), the SSD 412 lower the performance to reduce the heat generation. In addition, if the temperature of the SSD 412 further rises and reaches the temperature of the threshold value a, the SSD 412 further lowers the performance to reduce the heat generation.

In step S310, if the completion of startup of the application, the completion of installation of the application, or the termination of conflict of the jobs is detected (YES in step S310), the CPU 401 advances the processing to step S311. In step S311, the CPU 401 performs control to activate the thermal throttling function of the SSD 412 at the temperature of the MNTMT (50° C.).

As described above, according to the present exemplary embodiment, the CPU 401 dynamically switches between the first temperature reduction mode in steps S305 and S311 and the second temperature reduction mode in step S309. That allows the SSD 412 to provide its performance while to lower temperature more efficiently.

According to the first to the third exemplary embodiments, the CPU 401 always activates the thermal throttling function after the startup of the controller unit 400 and performs control to lower the temperature, which minimizes a configuration for a heat sink and a fan, reducing costs.

The CPU 401 operates the SSD 412 in the normal mode in processing for the startup of the controller unit 400 with the maximum performance of the SSD 412 alone from among operations of the controller unit 400. Further, the CPU 401 operates the SSD 412 in the temperature reduction mode in the other operations without the maximum performance of the SSD 412. That allows the controller unit 400 to achieve the performance while to lower the temperature of the SSD 412.

OTHER EMBODIMENTS

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)'), a flash memory device, a memory card, and the like.

While the present disclosure has been described with reference to the above exemplary embodiments, the present disclosure is not limited to the disclosed exemplary embodiments and includes various modifications without departing from the scope of the present disclosure.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-087538, filed May 25, 2021, which is hereby incorporated by reference herein in its entirety.

What is claimed is:

1. A control apparatus comprising:
a solid state drive having a thermal throttling function, wherein the solid state drive includes
a memory controller configured to control the solid state drive; and
a processor configured to control the control apparatus,
wherein the memory controller controls the thermal throttling function with a first temperature as a threshold value from startup of the control apparatus to startup completion,
wherein, in response to determining that the startup of the control apparatus has completed, the processor causes the memory controller to set the threshold value for a temperature at which the thermal throttling function is operated to a second temperature lower than the first temperature from the first temperature, and the memory controller controls the thermal throttling function with not the first temperature but the second temperature as the threshold value after the startup of the control apparatus has completed,
wherein the memory controller includes the thermal throttling function based on the threshold value and a different thermal throttling function based on a threshold value different from the threshold value,
wherein, in response to when a request for startup of an application, a request for installation of an application, or conflict of a plurality of jobs is detected, the processor causes the memory controller to set the second temperature as the different threshold value and to set a third temperature higher than the second temperature and lower than the first temperature as the threshold value, and
wherein the memory controller controls the thermal throttling function with the third temperature as the threshold value and controls the different thermal throttling function with the second temperature as the different threshold value.

2. The control apparatus according to claim 1, wherein a temperature of the solid state drive rises and reaches the first temperature from the startup of the control apparatus to the startup completion, thereby the solid state drive lowers performance to reduce heat generation, and
wherein the temperature of the solid state drive rises and reaches the second temperature after the startup completion of the control apparatus, thereby the solid state drive lowers performance to reduce heat generation.

3. The control apparatus according to claim 1, wherein the first temperature is an initial set value.

4. The control apparatus according to claim 1, wherein the second temperature is a minimum value settable in the solid state drive.

5. The control apparatus according to claim 1, wherein, in response to when an issuance of a shutdown command is detected, the processor causes the memory controller to set the first temperature as the threshold value, and the memory controller controls the thermal throttling function of the solid state drive with the first temperature as the threshold value after the issuance of the shutdown command is detected.

6. The control apparatus according to claim 1, wherein, in response to when completion of startup of the application or completion of installation of the application is detected, the processor causes the memory controller to set the second temperature as the threshold value, and the memory controller controls the thermal throttling function of the solid state drive with the second temperature as the threshold value.

7. The control apparatus according to claim 1, wherein, in response to when a processor detects the request for startup of an application, the request for installation of an application, or the conflict of the plurality of jobs is detected, and a temperature of the solid state drive rises and reaches the third temperature, the solid state drive lowers performance to reduce heat generation and, in response to when the temperature of the solid state drive further rises and reaches the third temperature, the solid state drive further lowers the performance to reduce the heat generation.

8. The control apparatus according to claim 7, wherein, in a case where the request for startup of an application, the request for installation of an application, or the conflict of the plurality of jobs is detected, and the temperature of the solid state drive is less than the third temperature, in response to when the temperature of the solid state drive rises and reaches the second temperature, the processor lowers the performance to reduce the heat generation, and in response to when the temperature of the solid state drive further rises and reaches the third temperature, the controller further lowers the performance to reduce the heat generation.

9. The control apparatus according to claim 1, wherein, in response to when completion of startup of the application, completion of installation of the application, or termination of the conflict of the plurality of jobs is detected, the memory controller controls the thermal throttling function with the second temperature as the threshold value.

10. The control apparatus according to claim 1, wherein the control apparatus is a control apparatus of an image forming apparatus.

11. An image forming apparatus comprising:
the control apparatus according to claim 1; and
a printer control unit configured to control a printer unit to print image data on a sheet based on control from the processor of the control apparatus.

12. A method of controlling a control apparatus that includes a solid state drive having a thermal throttling function, wherein the solid state drive includes a memory controller configured to control the solid state drive, and a processor configured to control the control apparatus, the method comprising:
controlling, via the memory controller, the thermal throttling function with a first temperature as a threshold value from startup of the control apparatus to startup completion;
causing, via the processor in response to determining that the startup of the control apparatus has completed, the memory controller to set the threshold value for a temperature at which the thermal throttling function is operated to a second temperature lower than the first temperature from the first temperature, and controlling, via the memory controller, the thermal throttling function with not the first temperature but the second temperature as the threshold value after the startup of the control apparatus has completed,
wherein the memory controller includes the thermal throttling function based on the threshold value and a different thermal throttling function based on a threshold value different from the threshold value, the method further comprising:
causing, via the processor in response to when a request for startup of an application, a request for installation of an application, or conflict of a plurality of jobs is detected, the memory controller to set the second temperature as the different threshold value and to set a third temperature higher than the second temperature and lower than the first temperature as the threshold value; and
controlling, via the memory controller, the thermal throttling function with the third temperature as the threshold value and controlling the different thermal throttling function with the second temperature as the different threshold value.

13. A non-transitory computer-readable storage medium storing a program to cause a computer to perform a method of controlling a control apparatus that includes a solid state drive having a thermal throttling function, wherein the solid state drive includes a memory controller configured to control the solid state drive, and a processor configured to control the control apparatus, the method comprising:
controlling, via the memory controller, the thermal throttling function with a first temperature as a threshold value from startup of the control apparatus to startup completion;
causing, via the processor in response to determining that the startup of the control apparatus has completed, the memory controller to set the threshold value for a temperature at which the thermal throttling function is operated to a second temperature lower than the first temperature from the first temperature, and controlling, via the memory controller, the thermal throttling function with not the first temperature but the second temperature as the threshold value after the startup of the control apparatus has completed,
wherein the memory controller includes the thermal throttling function based on the threshold value and a different thermal throttling function based on a threshold value different from the threshold value, the method further comprising:
causing, via the processor in response to when a request for startup of an application, a request for installation of an application, or conflict of a plurality of jobs is detected, the memory controller to set the second temperature as the different threshold value and to set a third temperature higher than the second temperature and lower than the first temperature as the threshold value; and
controlling, via the memory controller, the thermal throttling function with the third temperature as the threshold value and controlling the different thermal throttling function with the second temperature as the different threshold value.

* * * * *